United States Patent

Wang et al.

[11] Patent Number: 5,965,931
[45] Date of Patent: Oct. 12, 1999

[54] BIPOLAR TRANSISTOR HAVING BASE REGION WITH COUPLED DELTA LAYERS

[75] Inventors: Kang L. Wang, Santa Monica, Calif.; Timothy K. Carns, Boise, Id.; Xinyu Zheng, Los Angeles, Calif.

[73] Assignee: The Board of Regents of the University of California, Oakland, Calif.

[21] Appl. No.: 08/306,795

[22] Filed: Sep. 15, 1994

Related U.S. Application Data

[63] Continuation-in-part of application No. 08/049,197, Apr. 19, 1993.

[51] Int. Cl.[6] .................. H01L 27/082; H01L 27/102; H01L 29/70; H01L 31/11
[52] U.S. Cl. .................. 257/585; 257/572; 257/583
[58] Field of Search .................. 257/585, 572, 257/583

[56] References Cited

U.S. PATENT DOCUMENTS

| | | | |
|---|---|---|---|
| 4,926,221 | 5/1990 | Levi | 357/16 |
| 5,013,685 | 5/1991 | Chiu et al. | 437/184 |

OTHER PUBLICATIONS

Koremer, "Heterostructure Bipolar Transistors and Integrated Circuits," 0018–9219/82/0100–0013, 1982 IEEE, pp. 13–25.

Patton, et al., "75–GHz $f_T$ SiGe–Base Heterojunction Bipolar Transistors," IEEE Electron Device Letters, vol. 11, No. 4, Apr. 1990, pp. 171–173.

Malik, et al., "A Planar–Doped 2D–Hole Gas Base AlGaAs/GaAs Heterojunction Bipolar Transistor Grown by Molecular Beam Epitaxy," IEEE Electron Device Letters, vol. 9, No. 1, pp. 7–9.

Kuo, et al., "Planarized Be δ–Doped Heterostructure Bipolar Transistor Fabricated Using Doping Selective Contact and Selective Hole Epitaxy," Japanese Journal of Applied Physics, vol. 30, No. 2B, Feb. 1991, pp.L262–L265.

*Primary Examiner*—Stephen D. Meier
*Attorney, Agent, or Firm*—Townsend and Townsend and Crew LLP; Henry K. Woodward

[57] ABSTRACT

A bipolar transistor includes multiple coupled delta layers in the base region between the emitter and collector regions to enhance carrier mobility and conductance. The delta layers can be varied in number, thickness, and dopant concentration to optimize desired device performance and enhanced mobility and conductivity vertically for emitter to collector and laterally parallel to the delta-doped layers. The transistors can be homojunction devices or heterojunction devices formed in either silicon or III-V semiconductor material.

5 Claims, 4 Drawing Sheets

BIPOLAR TRANSISTOR HAVING BASE REGION WITH COUPLED DELTA LAYERS

This is continuation-in-part of copending application U.S. Ser. No. 08/049,197 filed Apr. 19, 1993 for Bipolar Transistor Having Base Region with Coupled Delta Layers.

BACKGROUND OF THE INVENTION

This invention relates generally to semiconductor devices, and more particularly the invention relates to bipolar transistor devices.

The bipolar transistor is comprised of an emitter region and a collector region of the same conductivity type in a semiconductor body separated by a base region of opposite conductivity type. Conduction in the bipolar transistor is controlled by the biases across both emitter-base and the collector-base junctions.

One of the key features of the bipolar transistor is its extremely high operating speed. At present the fastest bipolar devices are fabricated in III-V semiconducting materials, (e.g., aluminum gallium arsenide/gallium arsenide) semiconductor material. However, in order to attain a high level of integration in current technology, silicon-based semiconductor material must be used. Emitter engineering has been employed in heterojunction bipolar devices in order to improve speed and current gain by using wider band-gap materials for the emitter so that higher base doping can be achieved which leads to a lower base resistance. The reduction in base resistance results in higher operating frequencies. High operating frequencies have been demonstrated in silicon/germanium heterojunction bipolar transistors due to the use of highly doped base layers with reduced base resistance. Emitter engineering with heterojunctions has improved device performance but requires more complex device growth and processing.

Delta doped layers have been used in transistor devices to improve speed. A delta doped layer is a thin (e.g., 50 Å) highly doped layer with a dopant concentration of $10^{13}$ or $10^{14}$ atoms per square centimeter, for example. The delta layer may be formed using molecular beam epitaxy or other advanced epitaxial techniques. Kuo et al. "Planarized Be Delta Doped Heterostructure Bipolar Transistor Fabricated Using Doping Selective Contact and Selective Hole Epitaxy," *Japanese Journal of Applied Physics*, Vol. 30, No. 2B, February, 1991, pp. 262–265, discloses a bipolar transistor in which a single p+ doped delta layer in an undoped gallium arsenide layer of 100 Å thickness forms the base of a heterojunction bipolar transistor. Operating speed of the device is increased due to the thinness of the delta doped based layer.

SUMMARY OF THE INVENTION

The present invention is directed to an improved homojunction bipolar transistor and heterojunction bipolar transistor having a plurality of coupled delta doped layers in the base region.

We have discovered that carrier mobility enhancement can be realized in simple homoepitaxially grown semiconductor structures by placing at least two delta layers in close proximity (e.g., on the order of 200 Å) with one another. By incorporating a plurality of delta doped and coupled layers in the base region of a bipolar transistor, enhanced mobility and conductivity in the lateral direction (parallel to the delta-doped layers) is realized over uniformly doped bulk semiconductor layers whose thickness gives the same bulk doping density as the coupled delta layers. The reduction in base resistance leads to high speed applications as well as improved emitter to collector charge transport due to reduced Coulomb scattering in the thin base. Although the device concepts are applicable to heterojunction and homojunction bipolars, advantageously, the devices can be fabricated in all silicon semiconductor material.

The invention and objects and features thereof will be more readily apparent when the following detailed description and appended claims are taken with the drawing.

DESCRIPTION OF SPECIFIC EMBODIMENTS

Figure 1:
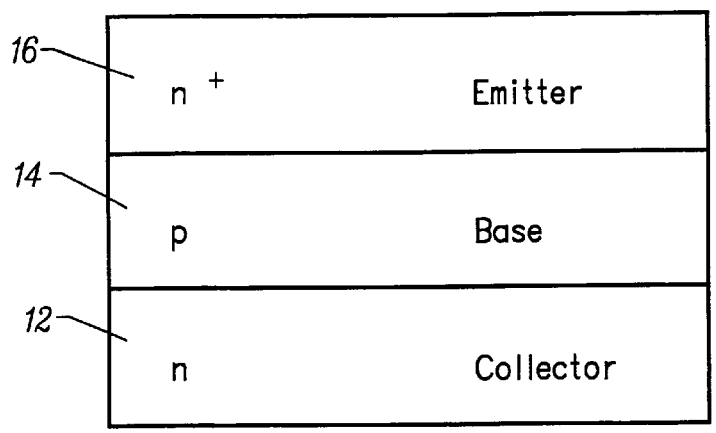
FIG. 1 is a schematic cross-section view of a conventional npn bipolar transistor, showing the emitter, base and collector layers.

Referring now to the drawing, FIG. 1 is a schematic section view of a conventional bipolar transistor. A homojunction transistor typically comprises a single crystal semiconductor body such as silicon or a III-V material such as gallium arsenide. A collector region 12 may be formed from the bulk semiconductor material or from an epitaxial layer grown on a substrate. In the illustrated silicon npn bipolar transistor, the collector will have an n-type dopant concentration on the order of $10^{14}$–$10^{15}$ atoms per cubic centimeter of phosphorus or arsenic. The base region 14 has a net p-dopant concentration on the order of $10^{16}$–$10^{18}$ atoms per cubic centimeter of boron, for example, and the emitter region 16 will have a net n-type dopant concentration of on the order of $10^{17}$–$10^{20}$ atoms per cubic centimeter of phosphorus or arsenic. In a heterojunction bipolar transistor, the emitter-base junction will be characterized by a silicon-germanium alloy of one conductivity type as the base abutting silicon of an opposite conductivity type as the emitter, whereas in a III-V transistor structure the emitter-base junction will be characterized by gallium arsenide of one conductivity abutting aluminum gallium arsenide, for example, of an opposite conductivity type.

As above described, emitter engineering has been employed in the heterojunction bipolar transistor in order to improve speed and current gain by using the wider band-gap materials for the emitter so that higher base doping can be achieved and thus lower the base resistance. Further, a single delta doped layer has been utilized for the base in aluminum gallium arsenide/gallium arsenide heterojunction bipolar transistors to provide a speed improvement due to the thin nature of the delta-layer base and the similar conductivity in the lateral direction for comparable base sheet resistances as in the uniformly-doped base transistor.

Figure 2:
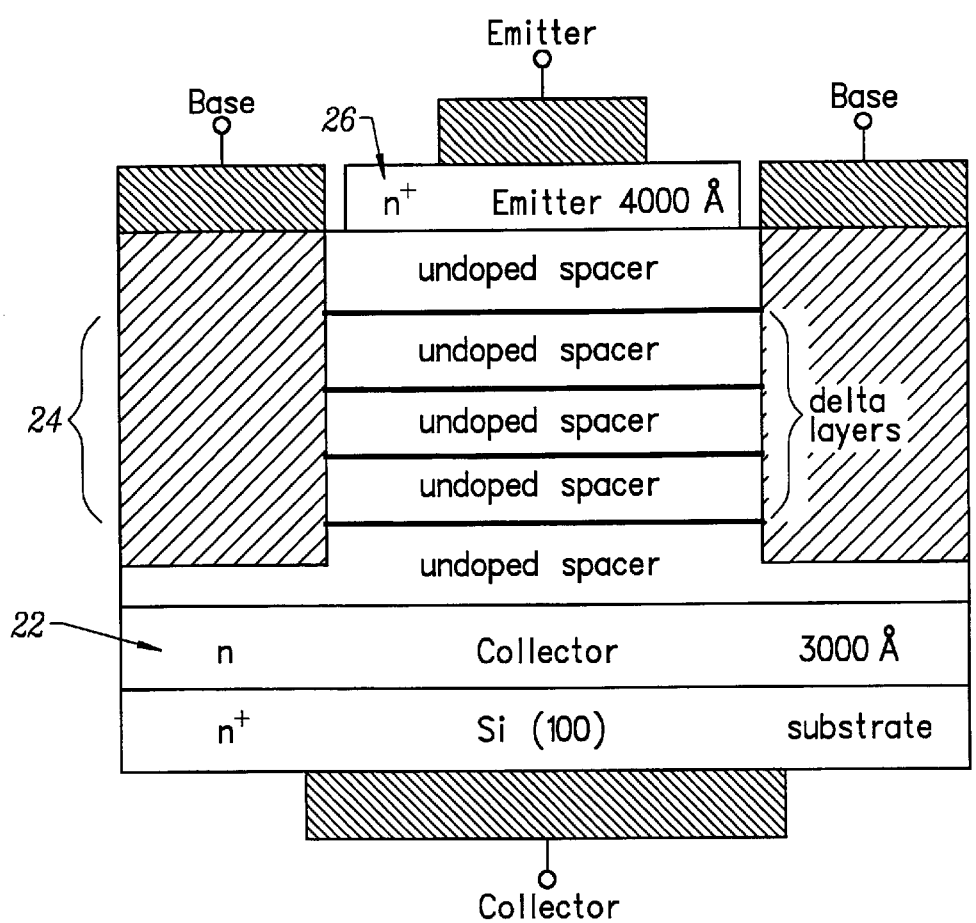
FIG. 2 is a schematic cross-section view of an npn bipolar transistor including a base with coupled delta layers in accordance with one embodiment of the invention.

In accordance with the present invention, a homojunction bipolar transistor includes a plurality of coupled delta-layers in the base of the bipolar transistor for enhanced carrier mobility and conductivity in the lateral direction to reduce the base sheet resistance. FIG. 2 is a schematic cross-section representation of one embodiment of a transistor in accordance with the invention in which the base region comprises four coupled delta-layers. In this embodiment, the collector 22 and the emitter 26 have n-type dopants similar in concentration to the structure of FIG. 1. In a simple homoepitaxially grown semiconductor structure, the base region 24 comprises four delta-layers of approximately 50 Å in thickness and having a Hall sheet concentration of $1\times10^{12}$ atoms per square centimeter (corresponding to an average three-dimensional doping concentration of $2\times10^{18}$ atoms per cubic centimeter). The delta-layers are separated from one another and from the emitter and collector by undoped layers of semiconductor material of approximately 100 or 200 Å thickness.

More particularly, in a specific embodiment the silicon delta-layers were grown by silicon-molecular beam epitaxy (or other low-temperature techniques) on $n^-$, (100) silicon substrates at a growth temperature of about 600° C. Lower growth temperatures can be used to obtain thinner delta-doped layers and higher doping concentrations. Delta doping was achieved by the simultaneous deposition of silicon from an electron gun source and boron from a high temperature Knudsen cell. Alternatively, the delta-doped layers comprise different semiconductor material. Delta-doping can also be achieved by depositing only the dopant species and closing the Si shutter. The Hall sheet concentration of the layers is also approximately $1\times10^{12}$ cm$^{-2}$ per delta-layer. According to SIMS data for similar structures the FWHM is approximately 50 Å thus giving an average three-dimensional effective doping concentration of $2\times10^{18}$ cm$^{-3}$. Hole concentrations and mobilities were measured using the standard van der Pauw configuration under a magnetic field of 0.54 T. Aluminum was evaporated onto the samples and the structures were subsequently sintered for ohmic contact.

Figure 3A:
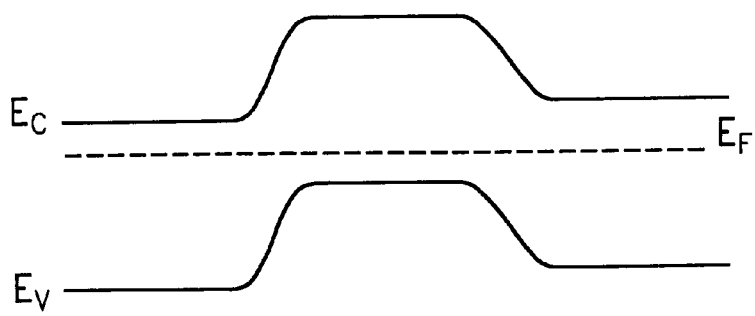
FIGS. 3A, 3B are energy band diagrams for the npn bipolar transistor of FIG. 1 in equilibrium and under an applied bias, respectively.
Figure 3B:
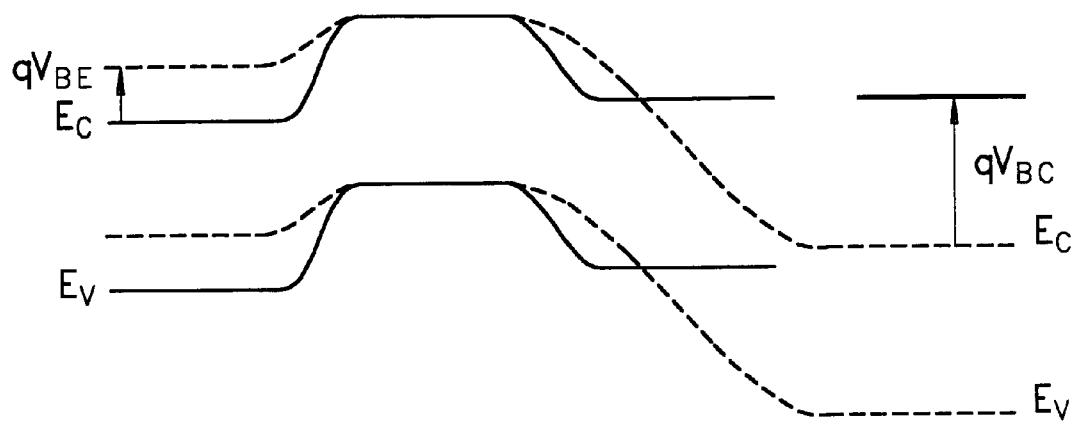
Figure 4A:
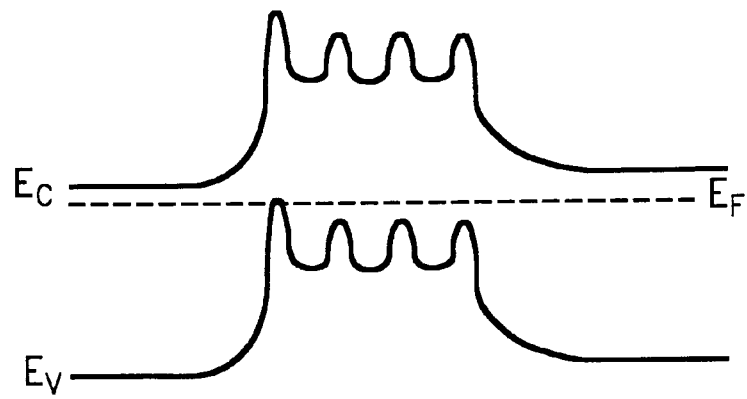
FIGS. 4A, 4B are energy band diagrams for the coupled delta layer base bipolar transistor of FIG. 2 in equilibrium and under bias, respectively.
Figure 4B:
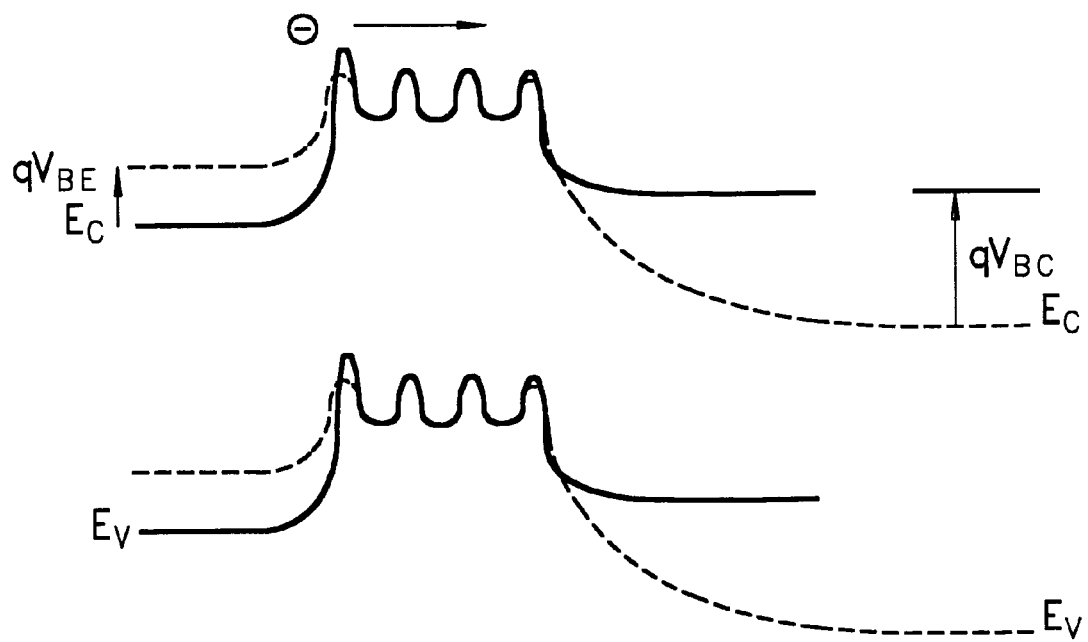

To further illustrate the concept, we use the npn transistors of FIGS. 1 and 2 as an example. The concept can be readily understood for a pnp transistor as well. FIG. 3A shows the energy band diagram of the conventional npn transistor in equilibrium and FIG. 3B shows the energy band for the transistor under bias. The uniformly doped base layer is now replaced with the coupled delta-layers structure, giving the energy band diagram shown in FIG. 4A in equilibrium and FIG. 4B under bias. Each of the delta-layers in the base may be doped differently and the undoped spacer separation may also be adjusted in order to improve device performance through band engineering. As disclosed by Levi, U.S. Pat. No. 4,926,221, one major advantage in adjusting the above parameters is enhanced electron transport injection from the emitter. The first barrier as shown in FIG. 4A is slightly higher than others. As shown in FIG. 4B, electrons from the emitter arrive at the base with an excess energy, leading to near ballistic transport of the electron through the base. Also, the electrons will only suffer Coulomb scattering in the very thin regions where the dopants are located. This scattering will be minimized due to the high speeds at which the carrier will pass through these thin delta-layers. At the collector, biasing will reduce the collector barrier, resulting in improved transport into the collector. Thus, the base doping profile can be engineered to have the correct potential profile for improving the overall performance of the device. For example, the injector ramp can be maximized at the emitter/base junction and minimized at the collector/base junction by adjusting the undoped cap layers between the delta-doped layers and the emitter, and the collector. The periodicity of the doping in the base can also be adjusted to optimize device performance. The advantages for improved carrier speeds in the vertical direction have been described in detail by Levi.

In this invention, we incorporate the idea of Levi for improved vertical transport with the concept of optimized spacing and doping density of the delta-doped layer for enhanced conductivity and, hence, improved lateral transport. As described by Carns et al., Zheng et al. ("Electron mobility enhancement from coupled wells in delta-doped GaAs," *Applied Physics Letters,* Vol. 62, No. 5, February, 1993, pp. 504–506), and Radpisheh et al. (International Conference on Solid State Devices and Materials, Japan, 1993, pp. 219–221), enhanced mobilities can be obtained parallel to the delta-doped layers when they are placed near one another. The degree of enhancement depends on the spacing between delta-doped layers, the carrier density (which affects the depth of the quantum well formed), and the width of the delta-doped layer (which affects the confinement of the carriers within the quantum well). The less confined the carriers, then the greater the enhancement.

Figure 5:
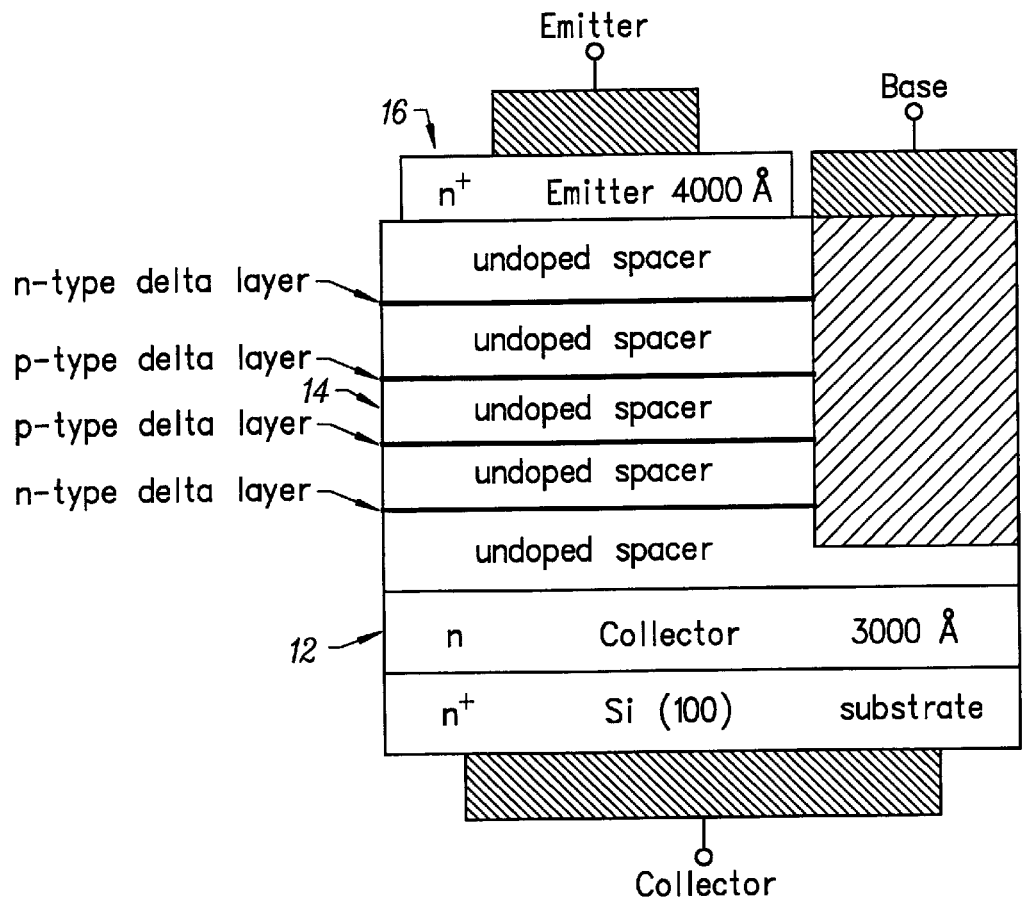
FIG. 5 is a schematic cross-section view of an npn transistor including a base with the compensated well structure in accordance with an embodiment of the invention.

The concept of quantum well coupling for improved conductivity can be exploited with other types of structures for better coupling. One such example is the 'compensated' well structure. This structure (shown in FIG. 5) incorporates delta-doped layers of opposite carrier-type on the outer edges of the original coupled delta-doped layer structure (e.g., n-p-p-n or p-n-n-p) which extend the delta-doped layers into the emitter 16 and collector 12. The doping level of the outer delta-doped layers should be lower than the inner delta-doped layers so that they may be fully compensated. These outer layers lead to sharper and deeper quantum wells. As a result, the carriers are more spread out and are less confined to the delta-doped layer, leading to more carriers suffering reduced Coulomb scattering and a higher overall mobility. One key advantage of this 'compensated' well structure is that these improvements can be expected at room temperature which is of particular importance from an industrial application point of view. Also, because the well is deeper, carrier injection from the base into the emitter well be suppressed."

The concept of using coupled delta layers can readily be applied to the pnp transistor by replacing the uniformly doped n-type base with coupled n-type delta-doped layers. The most promising feature of the coupled delta-layer bipolar transistor is that it can be used to improve bipolar device performance in homojunction devices, which are much more simple and less expensive to grow and fabricate when compared to the heterojunction devices. The coupled delta-layer structure can be used in any semiconductor material system. The most important one from an industrial point of view is silicon, for which the conductivity enhancement has been demonstrated and can be readily incorporated for VLSI.

Thus while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A bipolar transistor comprising
   semiconductor body,
   a first region in said semiconductor body of a first conductivity type and forming an emitter region,
   a second region in said semiconductor body of said first conductivity type spaced from said first region and forming a collector region,
   a third region in said semiconductor body between said first region and said second region and forming a base region, said third region including a plurality of delta-doped layers of a second conductivity type, said delta-doped layers being spaced to allow coupling between delta-doped layers for enhanced mobility and conductivity in a lateral direction of said base region parallel to said first and third regions, said delta-doped layers extending into the emitter region and into said collector region.

2. The bipolar transistor as defined by claim 1 wherein delta-doped layers of opposite carrier type are placed outside the delta-doped layers in said base region, in said emitter region and in said collector region.

3. The bipolar transistor as defined by claim 1 wherein junctions between emitter, base, and collector regions are homojunctions.

4. The bipolar transistor as defined by claim 1 wherein junctions between emitter, base, and collector regions are heterojunctions.

5. The bipolar transistor as defined by claim 1 and including a base contact laterally engaging each of said delta doped layers.

* * * * *